(12) United States Patent
Jung

(10) Patent No.: US 8,872,553 B1
(45) Date of Patent: Oct. 28, 2014

(54) FREQUENCY MULTIPLIER

(71) Applicant: SK hynix Inc., Icheon-si (KR)

(72) Inventor: Ji Wan Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/971,191

(22) Filed: Aug. 20, 2013

(30) Foreign Application Priority Data

Apr. 22, 2013 (KR) ........................ 10-2013-0044327

(51) Int. Cl.
*H03B 19/00* (2006.01)
*H03K 5/00* (2006.01)
(52) U.S. Cl.
CPC ................................. *H03K 5/00006* (2013.01)
USPC ....................................................... 327/119
(58) Field of Classification Search
USPC ................................................ 327/119, 116
See application file for complete search history.

(56) References Cited

U.S. PATENT DOCUMENTS 7,830,184 B2 * 11/2010 Kim et al. ..................... 327/116

FOREIGN PATENT DOCUMENTS

| KR | 100215625 B1 | 5/1999 |
| KR | 100493027 B1 | 5/2005 |

* cited by examiner

*Primary Examiner* — Daniel Rojas
(74) *Attorney, Agent, or Firm* — William Park & Associates Patent Ltd.

(57) ABSTRACT

A frequency multiplier includes: a multiphase signal generator configured to generate multiphase signals in response to a source signal; a pulse generator configured to generate a plurality of pulse signals in response to the multiphase signals; and a synthesizer configured to generate a frequency multiplication signal in response to edges of the pulse signals. Each of the plurality of pulse signals is generated in response to a corresponding multiphase signal, and the frequency multiplication signal is obtained by multiplying a frequency of the source signal.

20 Claims, 3 Drawing Sheets

FREQUENCY MULTIPLIER

CROSS-REFERENCES TO RELATED APPLICATION

The present application claims priority under 35 U.S.C. §119(a) to Korean application number 10-2013-0044327 filed on Apr. 22, 2013, in the Korean Intellectual Property Office, which is incorporated herein by reference in its entirety.

BACKGROUND

1. Technical Field

Various embodiments relate generally to a semiconductor circuit, and more particularly to a frequency multiplier.

2. Related Art

A known frequency multiplier is operated in such a manner is as to combine multiphase pulses.

Since the multiphase pulses of the known frequency multiplier are used to generate the next pulse while removing the last pulse, an overlap between the pulses may occur.

When an overlap between the pulses occurs, a swing of a final output signal, generated through the overlap between pulses, may be reduced in comparison to a target swing. Further, when the overlap between the pulses occurs, a DC current path may be formed to increase current consumption.

SUMMARY

A frequency multiplier capable of reducing current consumption is described herein.

In an embodiment of the present invention, a frequency multiplier includes: a multiphase signal generator configured to generate multiphase signals in response to a source signal; a pulse generator configured to generate a plurality of pulse signals in response to the multiphase signals; and a synthesizer configured to generate a frequency multiplication signal in response to edges of the respective pulse signals. Each of the plurality of pulse signals is generated in response to a corresponding multiphase signal, and the frequency multiplication signal is obtained by multiplying a frequency of the source signal.

The multiphase signal generator may include: a delay line configured to delay the source signal by a delay time adjusted in response to a delay control voltage and generate pre-multiphase signals; a buffer configured to buffer the pre-multiphase signals and generate the multiphase signals; a phase detector configured to detect a phase difference between two signals among the multiphase signals and generate a phase difference detection signal; and a charge pump configured to generate the delay control voltage in response to the phase difference detection signal.

The pulse generator may be configured to sequentially respond to the multiphase signals and generate the plurality of pulse signals in which falling pulses and rising pulses are repeated The synthesizer may include: a plurality of first switches configured to change the frequency multiplication signal to a first level in response to falling edges of even falling pulse signals among the plurality of pulses signals; and a plurality of second switches configured to change the frequency multiplication signal to a second level in response to rising edges of odd rising pulse signals among the plurality of pulse signals.

In an embodiment, a frequency multiplier includes a multiphase signal generator configured to generate even and odd multiphase signals in response to a source signal; a falling pulse generation unit configured to generate falling pulse signals in response to the even multiphase signals; a rising pulse generation unit configured to generate rising pulse signals in response to the odd multiphase signals; and a synthesizer configured to generate a frequency multiplication signal by combining the falling pulse signals and the rising pulse signals.

In an embodiment, a frequency multiplier includes a multiphase generator configured to generate multiphase signals with a predetermined phase difference through a delay time compensation process in response to source signals; a pulse generator configured to generate a plurality of pulse signals in response to the multiphase signals; and a synthesizer configured to generate a frequency multiplication signal in response to falling edges and rising edges of the plurality of pulse signals.

BRIEF DESCRIPTION OF THE DRAWINGS

Features, aspects, and embodiments are described in conjunction with the attached drawings, in which.

DETAILED DESCRIPTION

Hereinafter, a frequency multiplier according to the present invention will be described below with reference to the accompanying is drawings through embodiments.

Figure 1:
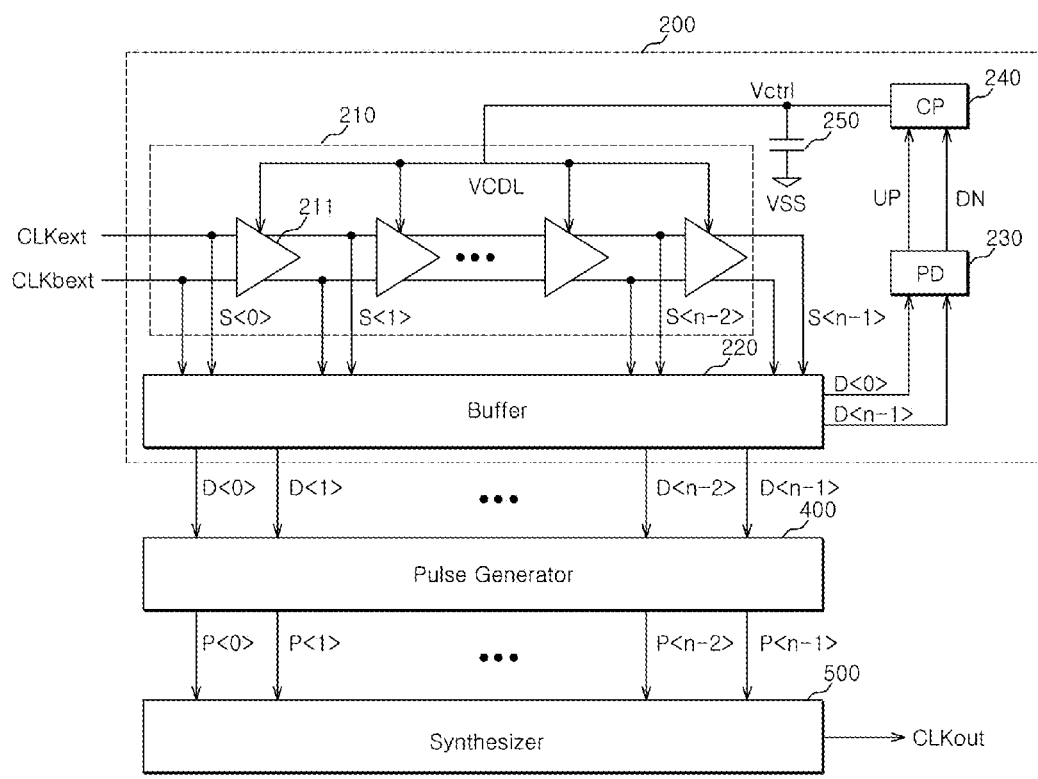
FIG. 1 is a circuit diagram of a frequency multiplier 100 according to an embodiment of the present invention.

FIG. 1 is a circuit diagram of a frequency multiplier 100 according to an embodiment of the present invention.

Referring to FIG. 1, the frequency multiplier 100 according to an embodiment of the present invention may include a multiphase signal generator 200, a pulse generator 400, and a synthesizer 500.

The multiphase signal generator 200 may be configured to generate multiphase signals D<0:n−1> in response to source signals, for example, clock signals CLKext and CLKbext.

The multiphase signal generator 200 may generate the multiphase signals D<0:n−1> having a predetermined phase difference through a delay time compensation process.

The multiphase signal generator 200 may comprise a delay locked loop (DLL).

The multiphase signal generator 200 may include a delay line 210, a buffer 220, a phase detector 230, a charge pump 240, and a capacitor 250.

The delay line 210 may include a plurality of delay units 211.

The plurality of delay units 211 may be configured to delay the clock signals CLKext and CLKbext by a delay time adjusted in response to a delay control voltage Vctrl and generate pre-multiphase signals S<0:n−1>.

The buffer 220 may be configured to buffer the pre-multiphase signals S<0:n−1> and generate the multiphase signals D<0:n−1>.

The phase detector 230 may be configured to detect a phase difference between the first signal D<0> and the last signal D<n—1> among the multiphase signals D<0:n−1> and generate phase difference detection signals UP and DN.

The charge pump 240 may be configured to generate the delay control voltage Vctrl by performing a pumping operation in response to the phase difference detection signals UP and DN.

The capacitor 250 may be configured to store the delay control voltage Vctrl while the charge pump 240 performs a pumping operation, and discharge the delay control voltage Vctrl while the pumping operation of the charge pump 240 is stopped.

Under various conditions, the first signal D<0> and the last signal D<n—1> may have the same phase as each other.

That is, under various conditions, the delay line 210 and the buffer 220 may be designed so that the first signal D<0> and the last signal D<n—1> have the same phase as each other.

However, the phases of the first signal D<0> and the last signal D<n—1> actually may not coincide with each other due to variations of the clock signals CLKext and CLKbext or variations in operation environment.

Thus, in an embodiment of the present invention, the phase detector 230, the charge pump 240, and the capacitor 250 may be used to compensate for a phase difference between the first signal D<0> and the last signal D<n—1>.

As a result, the multiphase signals D<0:n-1> may have a is constant delay time therebetween.

The pulse generator 400 may be configured to generate a plurality of pulse signals P<0:n-1> in response to multiphase signals D<0:n-1>. In an embodiment of the present invention, pulse generator 400 may generate each of the plurality of pulse signals P<0:n-1> in response to a corresponding multiphase signal between the multiphase signals D<0:n-1>.

The synthesizer 500 may be configured to generate a frequency multiplication signal CLKout in response to the pulse signals P<0:n-1>. In an embodiment of the present invention, the synthesizer 500 may be configured to generate a frequency multiplication signal CLKout at edges of the pulse signals P<0:n-1>, e.g., falling edges and rising edges.

The frequency multiplication signal CLKout may be obtained by multiplying a frequency of the clock signals CLKext and CLKbext by a preset ratio.

Figure 2:
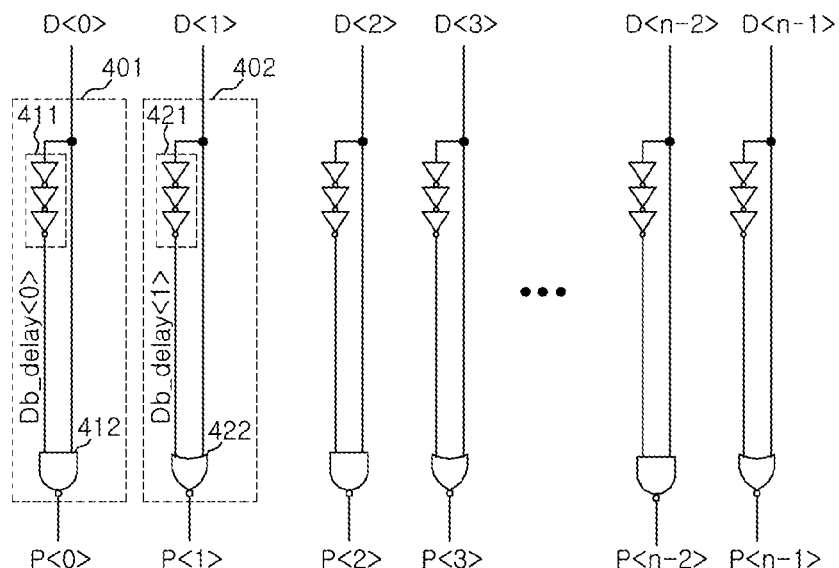
FIG. 2 is a circuit diagram illustrating the internal configuration of a pulse generator 400 of FIG. 1.

FIG. 2 is a circuit diagram illustrating the internal configuration of the pulse generator 400 of FIG. 1.

Referring to FIG. 2, the pulse generator 400 may include a plurality of falling pulse generation units 401 and a plurality of rising pulse generation units 402.

The plurality of falling pulse generation units 401 may be configured to generate even pulse signals P<0>, P<2>, ..., P<n-2> as falling pulse signals (hereinafter referred to as "even falling pulse signals") in response to even multiphase signals D<0>, D<2>, ..., D<n-2>.

The plurality of rising pulse generation units 402 may be configured to generate odd pulse signals P<1>, P<3>, ..., P<n—1> as rising pulse signals (hereinafter referred to as "odd rising pulse signals") in response to odd multiphase signals D<1>, D<3>, ..., D<n—1>.

Each of the falling pulse generation units 401 may include an inverter chain 411 and a NAND gate 412.

The inverter chain 411 may be configured to receive one of the even multiphase signals D<0>, D<2>, ..., D<n-2> and generate an inverted and delayed signal. For example, the inverter chain 411 may receive a multiphase signal D<0> and generate an inverted and delayed even multiphase signal Db_delay<0>.

The NAND gate 412 may be configured to receive one of the even multiphase signals D<0>, D<2>, ..., D<n-2> and the inverted and delayed signal and generate one of the even falling pulse signals P<0>, P<2>, ..., P<n-2>. For example, the NAND gate 412 may receive an even multiphase signal D<0> and the inverted and delayed even multiphase signal Db_delay<0> and generate an even falling pulse signal P<0>.

The pulse width of the even falling pulse signal P<0> may be set according to a signal delay time of the inverter chain 411.

The rising pulse generation unit 402 may include an inverter chain 421 and a NOR gate 422.

The inverter chain 421 may be configured to receive one of is odd multiphase signals D<1>, D<3>, ..., D<n—1> and generate an inverted and delayed signal. For example, the inverter chain 421 may receive an odd multiphase signal D<1> and generate an inverted and delayed odd multiphase signal Db_delay<1>.

The NOR gate 422 may be configured to receive one of the odd multiphase signal D<1>, D<3>, ..., D<n—1> and the inverted and delayed signal and generate one of the odd rising pulse signals P<1>, P<3>, ..., P<n—1>. For example, the NOR gate 422 may receive the odd multiphase signal D<1> and the inverted and delayed odd multiphase signal Db_delay<1> and generate an odd rising pulse signal P<1>.

The pulse width of the odd rising pulse signal P<1> may be set according to a signal delay time of the inverter chain 421.

As a result, the plurality of falling and rising pulse generation units of the pulse generator 400 may sequentially respond to the multiphase signals D<0:n-1> and generate the plurality of pulse signals P<0:n-1> where falling pulses and rising pulses are repeated.

In other words, the pulse generator 400 may generate the falling pulse signals P<0>, P<2>, ..., P<n-2> and the rising pulse signals P<1>, P<3>, ..., P<n—1> alternatively.

Figure 3:
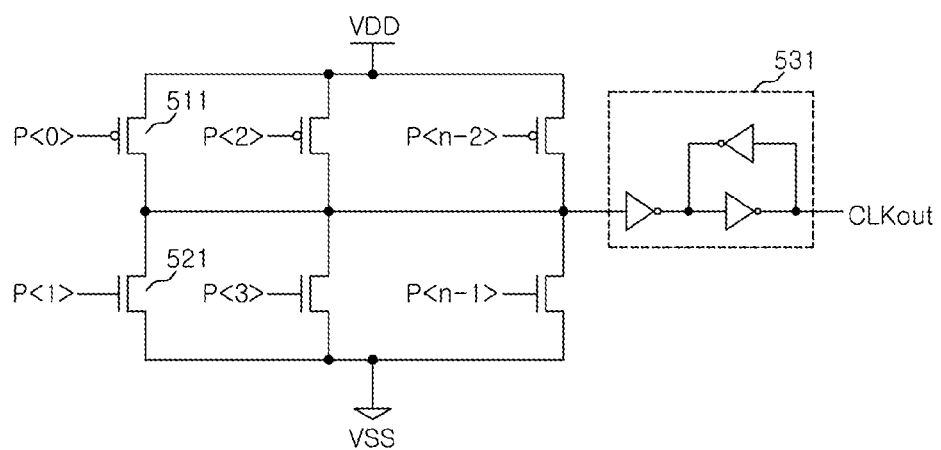
FIG. 3 is a circuit diagram illustrating the internal configuration of a synthesizer 500 of FIG. 1.

FIG. 3 is a circuit diagram illustrating the internal configuration of the synthesizer 500 of FIG. 1.

Referring to FIG. 3, the synthesizer 500 may include a plurality of first switches, a plurality of second switches, and a latch 531.

The plurality of first switches may include a plurality of PMOS transistors 511.

The plurality of second switches may include a plurality of NMOS transistors 521.

The sources of the PMOS transistors 511 may be commonly coupled to a power supply terminal, and the drains thereof may be commonly coupled to the latch 531.

The plurality of PMOS transistors 511 may receive the even falling pulse signals P<0>, P<2>, ..., P<n-2> through the gates thereof, respectively.

The sources of the NMOS transistors 521 may be commonly coupled to a ground terminal, and the drains thereof may be commonly coupled to the latch 531.

The plurality of NMOS transistors 521 may receive the odd rising pulse signals P<1>, P<3>, ..., P<n—1> through the gates thereof, respectively.

The latch 531 may be configured to prevent the frequency multiplication signal CLKout from floating during a disabled period of the PMOS transistors 511 and the NMOS transistors 521.

The synthesizer 500 may be configured to change a voltage level of an output terminal to a high level in response to the falling edges of the even falling pulse signals P<0>, P<2>, ..., P<n-2> and change the voltage level of the output terminal to a low level in response to the rising edges of the odd rising falling signals P<1>, P<3>, ..., P<n—1>, thereby generating the frequency multiplication signal CLKout. The frequency multiplication signal CLKout, according to an embodiment of the present invention, may be obtained by multiplying the frequency of the clock signals CLKext and CLKbext by a preset ratio.

Figure 4:
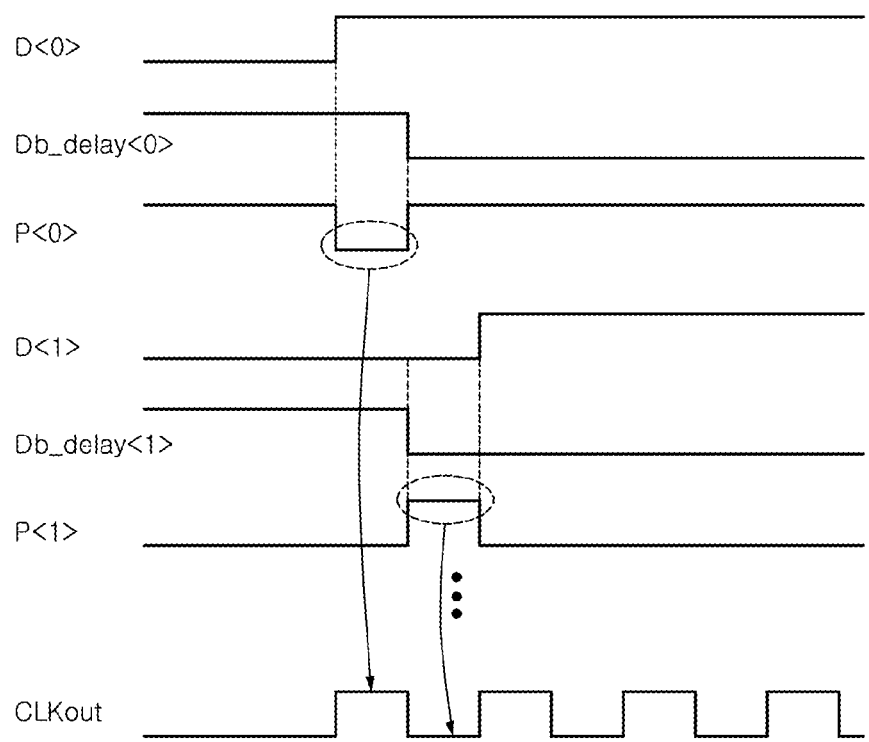
FIG. 4 is a timing diagram for explaining the operation according to an embodiment of the present invention.

FIG. 4 is a timing diagram for explaining the operation according to an embodiment of the present invention.

Referring to FIGS. 1 to 4, the frequency multiplication operation according to an embodiment of the present invention will be described as follows.

The multiphase signal generator 200 of FIG. 1 may generate the multiphase signals D<0:n−1> at predetermined time intervals.

When one even multiphase signal D<0> is inputted, the pulse generator 400 of FIG. 2 may combine the input signal with an inverted and delayed signal Db_delay<0> obtained by inverting and delaying the input signal, and generate an even falling pulse signal P<0>.

When one odd multiphase signal D<1> is inputted, the pulse generator 400 may combine the input signal with an inverted and delayed signal Db_delay<1> obtained by inverting and delaying the input signal, and generate an odd rising pulse signal P<1>.

In this way, the pulse generator 400 may generate a plurality of pulse signals P<0:n−1>.

As described above, the pulse generator 400 may generate the independent pulse signals P<0:n−1> in response to the respective multiphase signals D<0:n−1>.

The synthesizer 500 of FIG. 3 may change the voltage level of the output terminal to a high level in response to a falling edge of the even falling pulse signal P<0>.

Furthermore, the synthesizer 500 changes the voltage level of the output terminal to a low level in response to a rising edge of the odd rising pulse signal P<1> generated after the even falling pulse signal P<0>, thereby generating a clock pulse.

The above-described operation is repeated for the even falling pulse signals P<2>, . . . , P<n−2> and the odd rising pulse signals P<1>, . . . , P<n−2> so as to generate clock pulses. As a result, the frequency multiplication signal CLKout is generated by multiplying the frequency of the clock signals CLKext and CLKbext by a preset ratio.

While certain embodiments have been described above, it will be understood to those skilled in the art that the embodiments described are by way of example only. Accordingly, the frequency multiplier described herein should not be limited based on the described embodiments. Rather, the frequency multiplier described herein should only be limited in light of the claims that follow when taken in conjunction with the above description and accompanying drawings.

What is claimed is:

1. A frequency multiplier comprising:
a multiphase signal generator configured to generate multiphase signals in response to a source signal;
a pulse generator configured to generate a plurality of pulse signals in response to the multiphase signals; and
a synthesizer configured to change a logic level of a frequency multiplication signal to a first logic level in response to edges of even numbered signals among the pulse signals, and change the logic level of the frequency multiplication signal to a second logic level in response to edges of odd numbered signals among the pulse signals,
wherein each of the plurality of pulse signals is generated in response to a corresponding multiphase signal.

2. The frequency multiplier according to claim 1, wherein the source signal comprises a clock signal.

3. The frequency multiplier according to claim 1, wherein the multiphase signal generator comprises:
a delay line configured to delay the source signal by a delay time adjusted in response to a delay control voltage and generate pre-multiphase signals;
a buffer configured to buffer the pre-multiphase signals and generate the multiphase signals;
a phase detector configured to detect a phase difference between two signals among the multiphase signals and generate a phase difference detection signal; and
a charge pump configured to generate the delay control voltage in response to the phase difference detection signal.

4. The frequency multiplier according to claim 3, wherein the phase detector detects a phase difference of the first signal and the last signal among the multiphase signals, and generates the phase difference detection signal.

5. The frequency multiplier according to claim 1, wherein the pulse generator is configured to sequentially respond to the multiphase signals and generate the plurality of pulse signals in which falling pulses and rising pulses are repeated.

6. The frequency multiplier according to claim 1, wherein the pulse generator comprises:
a plurality of falling pulse generation units configured to generate falling pulse signals among the plurality of pulse signals in response to even multiphase signals; and
a plurality of rising pulse generation units configured to generate rising pulse signals among the plurality of pulse signals in response to odd multiphase signals.

7. The frequency multiplier according to claim 6, wherein each of the falling pulse generation units comprises:
an inverter chain configured to receive one of the even multiphase signals and generate an inverted and delayed signal; and
a logic gate configured to receive one of the even multiphase signals and the inverted and delayed signal and generate a falling pulse signal.

8. The frequency multiplier according to claim 7, wherein the falling pulse signal has a pulse width which is set according to a signal delay time of the inverter chain.

9. The frequency multiplier according to claim 6, wherein each of the rising pulse generation units comprises:
an inverter chain configured to receive one of the odd multiphase signals and generate an inverted and delayed signal; and
a logic gate configured to receive one of the odd multiphase signals and the inverted and delayed signal and generate a rising pulse signal.

10. The frequency multiplier according to claim 9, wherein the rising pulse signal has a pulse width which is set according to a signal delay time of the inverter chain.

11. The frequency multiplier according to claim 1, wherein the synthesizer comprises:
a plurality of first switches configured to change the logic level of the frequency multiplication signal to a logic high level in response to first edges of the even numbered signals among the pulse signals; and
a plurality of second switches configured to change the logic level of the frequency multiplication signal to a logic low level in response to second edges of the odd numbered signals among the pulse signals.

12. The frequency multiplier according to claim 11, further comprising a latch configured to latch and output the level-changed frequency multiplication signal.

13. A frequency multiplier comprising:
a multiphase signal generator configured to generate even and odd multiphase signals in response to a source signal;
a falling pulse generation unit configured to generate falling pulse signals in response to the even multiphase signals;

a rising pulse generation unit configured to generate rising pulse signals in response to the odd multiphase signals; and a synthesizer configured to change a logic level of a frequency multiplication signal to a first logic level in response to edges of the falling pulse signals, and change the logic level of the frequency multiplication signal to a second logic level in response to edges of the rising pulse signals.

14. The frequency multiplier according to claim 13, wherein the multiphase signal generator comprises a delay locked loop.

15. The frequency multiplier according to claim 13, further comprising a latch configured to latch and output the level-changed frequency multiplication signal.

16. A frequency multiplier comprising:

a multiphase generator configured to generate multiphase signals with a predetermined phase difference through a delay time compensation process in response to source signals;

a pulse generator configured to generate a plurality of pulse signals in response to the multiphase signals; and a synthesizer configured to change a logic level of a frequency multiplication signal to a first logic level in response to falling edges of even numbered signals among the pulse signals, and change the logic level of the frequency multiplication signal to a second logic level in response to rising edges of odd numbered signals among the pulse signals.

17. The frequency multiplier of claim 16, further comprising:

a plurality of delay units configured to delay the source signals by a delay time in response to a delay control voltage.

18. The frequency multiplier of claim 17, further comprising:

a charge pump configured to perform a pumping operation to generate the delay control voltage in response to phase difference detection signals.

19. The frequency multiplier of claim 18, wherein the charge pump may be configured to compensate for a phase difference between a first signal and a last signal to allow the multiphase signals to have a constant delay time.

20. The frequency multiplier of claim 16, wherein the synthesizer is configured to generate the frequency multiplication signal by a multiplication of a frequency to a preset ratio.

* * * * *